United States Patent
Adachi et al.

(10) Patent No.: US 9,783,734 B2
(45) Date of Patent: Oct. 10, 2017

(54) DELAYED FLUORESCENCE MATERIAL AND ORGANIC ELECTROLUMINESCENCE DEVICE

(75) Inventors: Chihaya Adachi, Fukuoka (JP); Kenichi Goushi, Fukuoka (JP); Kou Yoshida, Fukuoka (JP)

(73) Assignee: KYULUX, INC., Fukuoka (JP)

( * ) Notice: Subject to any disclaimer, the term of this patent is extended or adjusted under 35 U.S.C. 154(b) by 1054 days.

(21) Appl. No.: 13/220,319

(22) Filed: Aug. 29, 2011

(65) Prior Publication Data

US 2012/0217869 A1   Aug. 30, 2012

(30) Foreign Application Priority Data

Feb. 28, 2011   (JP) ................. 2011-042965

(51) Int. Cl.
| | | |
|---|---|---|
| H01L 51/54 | (2006.01) | |
| C09K 11/06 | (2006.01) | |
| H05B 33/14 | (2006.01) | |
| H01L 51/00 | (2006.01) | |
| H01L 51/50 | (2006.01) | |

(52) U.S. Cl.
CPC .......... *C09K 11/06* (2013.01); *H01L 51/0059* (2013.01); *H05B 33/14* (2013.01); *C09K 2211/1007* (2013.01); *C09K 2211/1011* (2013.01); *C09K 2211/1014* (2013.01); *C09K 2211/1059* (2013.01); *H01L 51/5012* (2013.01); *H01L 2251/308* (2013.01); *H01L 2251/552* (2013.01)

(58) Field of Classification Search
None
See application file for complete search history.

(56) References Cited

U.S. PATENT DOCUMENTS

| | | | | |
|---|---|---|---|---|
| 5,955,836 | A * | 9/1999 | Boerner et al. ............... | 313/506 |
| 6,392,339 | B1 * | 5/2002 | Aziz ................... | H01L 51/5012 |
| | | | | 313/503 |
| 6,468,675 | B1 * | 10/2002 | Ishikawa ............ | H01L 51/0059 |
| | | | | 313/504 |
| 6,861,502 | B1 | 3/2005 | Towns et al. | |
| 6,897,473 | B1 | 5/2005 | Burroughes et al. | |
| 2001/0037012 | A1 | 11/2001 | Towns et al. | |
| 2003/0153725 | A1 | 8/2003 | Towns et al. | |
| 2003/0186079 | A1 | 10/2003 | Towns et al. | |
| 2003/0194577 | A1 | 10/2003 | Towns et al. | |
| 2004/0075381 | A1 | 4/2004 | Burroughes et al. | |
| 2005/0048310 | A1 * | 3/2005 | Cocchi et al. ............... | 428/690 |
| 2005/0064231 | A1 | 3/2005 | Towns et al. | |
| 2005/0133783 | A1 * | 6/2005 | Yamazaki et al. ........... | 257/40 |
| 2005/0184658 | A1 | 8/2005 | Burroughes et al. | |
| 2006/0246613 | A1 | 11/2006 | Burroughes et al. | |
| 2006/0263917 | A1 | 11/2006 | Burroughes et al. | |
| 2008/0053520 | A1 | 3/2008 | Towns et al. | |
| 2009/0096363 | A1 | 4/2009 | Burroughes et al. | |
| 2010/0090209 | A1 | 4/2010 | Ikari et al. | |

FOREIGN PATENT DOCUMENTS

| | | | |
|---|---|---|---|
| JP | 2004199875 A | | 7/2004 |
| JP | 2004214180 A | | 7/2004 |
| JP | 2004-241374 A | | 8/2004 |
| JP | 2005353288 A | | 12/2005 |
| JP | 2006-24830 A | | 1/2006 |
| JP | 2006128632 A | | 5/2006 |
| JP | 2007070282 A | * | 3/2007 |
| JP | 2008-247810 A | | 10/2008 |
| JP | 2010-045383 A | | 2/2010 |
| JP | 2010-114425 A | | 5/2010 |
| JP | 2010-235708 A | | 10/2010 |
| JP | 2010-277765 A | | 12/2010 |
| WO | 2006/130353 A2 | | 12/2006 |

OTHER PUBLICATIONS

Eom et al. "Effect of electron injection and transport materials on efficiency of deep-blue phosphorescent organic light-emitting devices" Organic Electronics 2009, 10, 686-691. Year of publication: 2009.*
Ko et al. Organic Electronics 2010, 11, 1005-1009. Date of publication: Mar. 20, 2010.*
Machine translation of JP2007-070282. Date of publication: Mar. 22, 2007.*
Xiao et al. Adv. Mater. 2009, 21, 1271-1274. Year of publication: 2009.*
Palilis, L. C. et al., "Highly efficient molecular organic light-emitting diodes based on exciplex emission", Applied Physics Letters, vol. 82, No. 14, pp. 2209-2211, 2003.
M. Cocchi et al "Efficient exciplex emitting organic electroluminescent device" Applied Physics Letters 80:13:2401-2403 (2002).

(Continued)

*Primary Examiner* — Andrew K Bohaty
(74) *Attorney, Agent, or Firm* — Browdy and Neimark, P.L.L.C.

(57) ABSTRACT

A delayed fluorescence material containing a mixture of an acceptor compound and a donor compound that satisfies the following formulae (1) to (4):

$$T_1^A - S_1 > 0.2 \text{ eV} \quad (1)$$

$$T_1^D - S_1 \geq 0.2 \text{ eV} \quad (2)$$

$$|LUMO^A| > 2.0 \text{ eV} \quad (3)$$

$$|HOMO^D| \leq 5.3 \text{ eV} \quad (4)$$

wherein $T_1^A$ represents the excited triplet energy of the acceptor compound; $T_1^D$ represents the excited triplet energy defined of the donor compound; $S_1$ represents the excited singlet energy of the exciplex; $LUMO^A$ represents the energy level of LUMO of the acceptor compound; and $HOMO^D$ represents the energy level of HOMO of the donor compound.

5 Claims, 5 Drawing Sheets

(56) References Cited

OTHER PUBLICATIONS

Jessica J. Benson-Smith et al "Long-Lived Exciplex Formation and Delayed Excition Emission in Bulk Heterojunction Blends of Silole Derivative and Polyflurene Corolymer: The Role of Morphology on Exciplex Formation and Charge Seperation" The Jouranl of Physical Chemistry B. 113: 7794-7799 (2009).

Bernd Frederichs et al "Energy spitting between triplet and singlet exciplex states determined with E-type delayed fluorescence" Chemical Physics Letters 46:116-118 (2008).

Suehiro Iwata et al "Phosphorescence of the Charge-Transfer Triplet States of Some Molecular Complexes" The Jouranla of Chemical Physics 47:7:2203-2209 (1967).

M. Gordon et al "The Exciplex" Academic Press 31-34(1975).

Nicholas J. Turro et al "Modern Molecular Photochemistry of Organic Molecules" 4.32:240-242 (2010).

Official Action dated May 20, 2014, issued in the corresponding Japanese Patent Application. No. 2012-040308.

Goushi, et al., High reverse intersystem crossing efficiency using an exciplex state and application to organic light-emitting diodes, nature photonics, 2012, Supplementary Information, pp. 1-10.

Oyamada, et al., Measurement of Work Function of Organic Thin Film with AC-1, Data Base Series, 2003, cover page and pp. 21 and 36.

\* cited by examiner

DELAYED FLUORESCENCE MATERIAL AND ORGANIC ELECTROLUMINESCENCE DEVICE

CROSS-REFERENCE TO RELATED APPLICATIONS

The present application claims the benefit of priority from Japanese Patent Application No. 2011-42965, filed on Feb. 28, 2011, the contents of which are herein incorporated by reference in their entirety.

BACKGROUND OF THE INVENTION

Field of the Invention

The present invention relates to a novel delayed fluorescence material and to an organic electroluminescence material using the delayed fluorescence material.

Description of the Related Art

Studies for increasing the light emission efficiency of organic electroluminescent devices (organic EL devices) are being made actively. In particular, various studies of developing novel light-emitting materials for attaining more efficient light emission are being made. Among them, a delayed fluorescence material for delayed light emission is expected as a material that has a latent possibility of drastically increasing light emission efficiency. Until now, some delayed fluorescence materials containing a metal of Cu, Pt, In, Pd, Sn, Zn or the like have been proposed (for example, see Patent References 1 to 3).

On the other hand, only a few studies have heretofore been reported relating to a delayed fluorescence material that comprises an exciplex prepared by combining an acceptor compound and a donor compound. Non-Patent Reference 1 says that an external quantum efficiency of 3.4% could be attained by the use of an exciplex composed of N,N'-diphenyl-N,N'-(2-naphthyl)-1,1'-biphenyl-4,4'-diamine (NPB) and 2,5-di(3-biphenyl)-1,1'-dimethyl-3,4-diphenylsilacyclopentadiene (PPSPP). On the other hand, Patent References 4 and 5 say that forming an exciplex reduces light emission efficiency.

CITATION LIST

Patent References

Patent Reference 1: JP-A 2004-241374
Patent Reference 2: JP-A 2006-24830
Patent Reference 3: JP-A 2010-114425
Patent Reference 4: JP-A 2008-247810 (paragraph 0059)
Patent Reference 5: JP-A 2010-235708 (paragraph 0078)

Non-Patent Reference

Non-Patent Reference 1: L. C. Palilis, et al., Applied Physics Letters, Vol. 24, No. 14, 2209 (2003)

SUMMARY OF THE INVENTION

As in the above, increased light emission efficiency could not be realized in the past studies even though using an exciplex, but rather there has been a report saying that an exciplex would be a factor of reducing light emission efficiency. Given that situation, the present inventors have assiduously studied for the purpose of developing a novel retarded fluorescence material using an exciplex to thereby realize increased light emission efficiency.

As a result of assiduous studies for solving the above-mentioned problems, the present inventors have found that a mixture of an acceptor compound and a donor compound satisfying a specific condition can be an excellent retarded fluorescence material. Based on this finding, the inventors have achieved the present invention described in detail hereinunder as the means of solving the above-mentioned problems.

[1] A delayed fluorescence material comprising a mixture of an acceptor compound and a donor compound that satisfies the conditions represented by the following formulae (1) to (4):

$$T_1^A - S_1 > 0.2 \text{ eV} \quad (1)$$

$$T_1^D - S_1 \geq 0.2 \text{ eV} \quad (2)$$

$$|LUMO^A| > 2.0 \text{ eV} \quad (3)$$

$$|HOMO^D| \leq 5.3 \text{ eV} \quad (4)$$

wherein $T_1^A$ represents the excited triplet energy defined by the peak wavelength on the short wavelength side in the phosphorescence spectrum of the acceptor compound; $T_1^D$ represents the excited triplet energy defined by the peak wavelength on the short wavelength side in the phosphorescence spectrum of the donor compound; $S_1$ represents the excited singlet energy of the exciplex defined by the peak wavelength of the exciplex light emission observed in the light-emitting layer; $LUMO^A$ represents the energy level of LUMO (lowest unoccupied molecular orbital) of the acceptor compound; and $HOMO^D$ represents the energy level of HOMO (highest occupied molecular orbital) of the donor compound.

[2] The delayed fluorescence material of [1], wherein the molar content of the donor compound satisfies the following formula (5):

$$0.2 < D/(A+D) < 0.6 \quad (5)$$

wherein D represents the content (by mol) of the donor compound; and A represents the content (by mol) of the acceptor compound.

[3] The delayed fluorescence material of [1] or [2], wherein the acceptor compound contains a boron atom or a phosphorus atom.

[4] The delayed fluorescence material of [3], wherein the acceptor compound has a structure represented by any of the following formulae [1] to [4]:

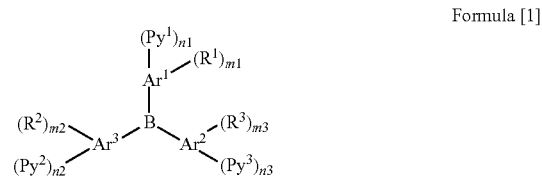

Formula [1]

wherein $Ar^1$, $Ar^2$ and $Ar^3$ each independently represent an aromatic hydrocarbon ring; $R^1$, $R^2$ and $R^3$ each independently represent a substituted or unsubstituted alkyl group, or a substituted or unsubstituted alkoxy group; $Py^1$, $Py^2$ and $Py^3$ each independently represent a substituted or unsubstituted pyridyl group; m1, m2 and m3 each independently indicate an integer of from 0 to 4; n1, n2 and n3 each independently indicate an integer of from 1 to 3;

Formula [2]

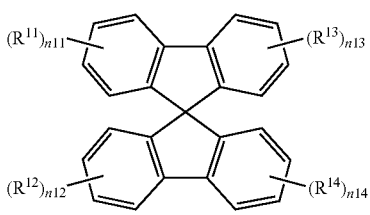

wherein $R^{11}$, $R^{12}$, $R^{13}$ and $R^{14}$ each independently represent

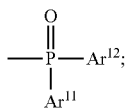

$Ar^{11}$ and $Ar^{12}$ each independently represent a substituted or unsubstituted aryl group; n11, n12, n13 and n14 each independently indicate an integer of from 0 to 2; and the sum total of n11, n12, n13 and n14 is at least 1;

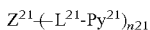

Formula [3]

wherein $Z^{21}$ represents a structure of any of the following:

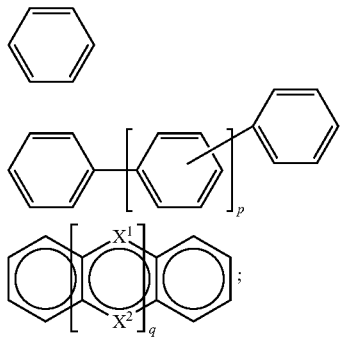

$X^1$ and $X^2$ are both —CH—, or $X^1$ is a single bond and $X^2$ is —CH═CH—, or $X^1$ is —CH═CH— and $X^2$ is a single bond; p indicates an integer of from 0 to 3; q indicates an integer of from 0 to 3; $L^{21}$ represents a substituted or unsubstituted arylene group; $Py^{21}$ represents a substituted or unsubstituted pyridyl group; n21 indicates an integer of from 2 to 6;

Formula [4]

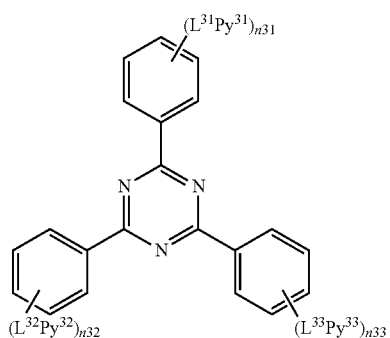

wherein $L^{31}$, $L^{32}$ and $L^{33}$ each independently represent a single bond or a substituted or unsubstituted arylene group; $Py^{31}$, $Py^{32}$ and $Py^{33}$ each independently represent a substituted or unsubstituted pyridyl group; n31, n32 and n33 each independently indicate an integer of from 1 to 3.

[5] The delayed fluorescence material of any one of [1] to [4], wherein the donor compound contains a nitrogen atom.

[6] The delayed fluorescence material of [5], wherein the donor compound has a structure represented by any of the following formulae [11] to [13]:

Formula [11]

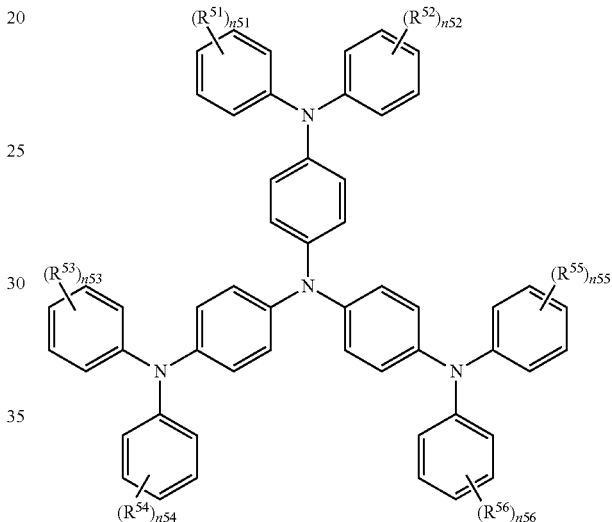

wherein $R^{51}$, $R^{52}$, $R^{53}$, $R^{54}$, $R^{55}$ and $R^{56}$ each independently represent a substituted or unsubstituted alkyl group, or a substituted or unsubstituted alkoxy group; n51, n52, n53, n54, n55 and n56 each independently indicate an integer of from 0 to 5; in the case where $R^{51}$ bonds to the neighboring carbon atoms of the benzene ring, the two $R^{51}$'s may bond to each other to form a linking group; in the case where $R^{52}$ bonds to the neighboring carbon atoms of the benzene ring, the two $R^{52}$'s may bond to each other to form a linking group; in the case where $R^{53}$ bonds to the neighboring carbon atoms of the benzene ring, the two $R^{53}$'s may bond to each other to form a linking group; in the case where $R^{54}$ bonds to the neighboring carbon atoms of the benzene ring, the two $R^{54}$'s may bond to each other to form a linking group; in the case where $R^{55}$ bonds to the neighboring carbon atoms of the benzene ring, the two $R^{55}$'s may bond to each other to form a linking group; in the case where $R^{56}$ bonds to the neighboring carbon atoms of the benzene ring, the two $R^{56}$'s may bond to each other to form a linking group;

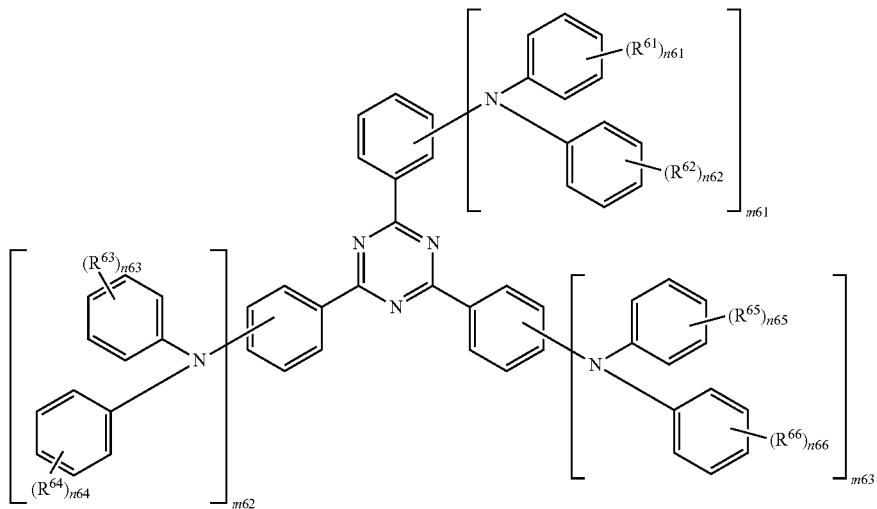

Formula [12]

wherein $R^{61}$, $R^{62}$, $R^{63}$, $R^{64}$, $R^{65}$ and $R^{66}$ each independently represent a substituted or unsubstituted alkyl group, or a substituted or unsubstituted alkoxy group; m61, m62 and m63 each independently indicate 1 or 2; n61, n62, n63, n64, n65 and n66 each independently indicate an integer of from 0 to 5; in the case where $R^{61}$ bonds to the neighboring carbon atoms of the benzene ring, the two $R^{61}$'s may bond to each other to form a linking group; in the case where $R^{62}$ bonds to the neighboring carbon atoms of the benzene ring, the two $R^{62}$'s may bond to each other to form a linking group; in the case where $R^{63}$ bonds to the neighboring carbon atoms of the benzene ring, the two $R^{63}$'s may bond to each other to form a linking group; in the case where $R^{64}$ bonds to the neighboring carbon atoms of the benzene ring, the two $R^{64}$'s may bond to each other to form a linking group; in the case where $R^{65}$ bonds to the neighboring carbon atoms of the benzene ring, the two $R^{65}$'s may bond to each other to form a linking group; in the case where $R^{66}$ bonds to the neighboring carbon atoms of the benzene ring, the two $R^{66}$'s may bond to each other to form a linking group;

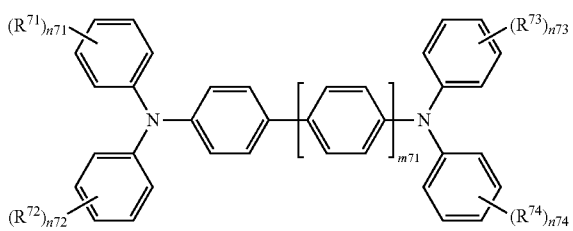

Formula [13]

wherein $R^{71}$, $R^{72}$, $R^{73}$ and $R^{74}$ each independently represent a substituted or unsubstituted alkyl group, a substituted or unsubstituted alkoxy group, or the following group:

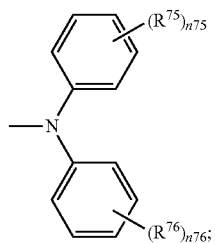

$R^{75}$ and $R^{76}$ each independently represent a substituted or unsubstituted alkyl group, or a substituted or unsubstituted alkoxy group; m71 indicates 0 or 1; n71, n72, n73, n74, n75 and n76 each independently indicate an integer of from 0 to 5; in the case where $R^{71}$ bonds to the neighboring carbon atoms of the benzene ring, the two $R^{71}$'s may bond to each other to form a linking group; in the case where $R^{72}$ bonds to the neighboring carbon atoms of the benzene ring, the two $R^{72}$'s may bond to each other to form a linking group; in the case where $R^{73}$ bonds to the neighboring carbon atoms of the benzene ring, the two $R^{73}$'s may bond to each other to form a linking group; in the case where $R^{74}$ bonds to the neighboring carbon atoms of the benzene ring, the two $R^{74}$'s may bond to each other to form a linking group; in the case where $R^{75}$ bonds to the neighboring carbon atoms of the benzene ring, the two $R^{75}$'s may bond to each other to form a linking group; in the case where $R^{76}$ bonds to the neighboring carbon atoms of the benzene ring, the two $R^{76}$'s may bond to each other to form a linking group.

[7] An organic electroluminescence device using the delayed fluorescence material of any one of [1] to [6] in the light-emitting layer thereof.

[8] The organic electroluminescence device of [7], which is so designed that the light-emitting layer is laminated between a layer containing the acceptor compound and a layer containing the donor compound.

In the delayed fluorescence material of the invention an acceptor compound and a donor compound satisfying the specific conditions are mixed to form an exciplex, and is therefore characterized in that its light emission efficiency is extremely high. The organic electroluminescence device using the delayed fluorescence material of the invention has a high exciton forming efficiency and a high external quantum efficiency.

MODE FOR CARRYING OUT THE INVENTION

Figure 1:
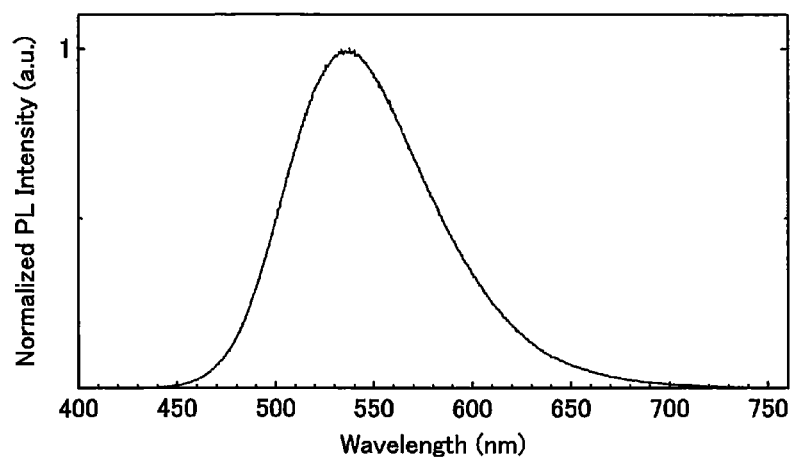
FIG. 1 shows a PL spectrum of the sample 3 in Example 1.

The contents of the invention are described in detail hereinunder. The description of the constitutive elements of the invention given hereinunder is for some typical embodiments of the invention, to which, however, the invention should not be limited. In this description, the numerical range expressed by the wording "a number to another number" means the range that falls between the former number indicating the lowermost limit of the range and the latter number indicating the uppermost limit thereof.

[Acceptor Compound]

The acceptor compound to constitute the exciplex in the invention is a compound that satisfies the conditions of the formula (1) and the formula (3). Specifically, the excited triplet energy ($T_1^A$) defined by the peak wavelength on the short wavelength side in the phosphorescence spectrum of the acceptor compound is larger than the excited singlet energy ($S_1$) of the exciplex defined by the peak wavelength of the exciplex light emission, and the difference therebetween must be more than 0.2 eV. Preferably, the difference between the excited triplet energy ($T_1^A$) of the acceptor compound and the excited singlet energy ($S_1$) of the exciplex is more than 0.3 eV, even more preferably more than 0.4 eV. In addition, the energy level of LUMO of the acceptor compound ($|LUMO^A|$) must be more than 2.0 eV, and is preferably more than 2.5 eV, more preferably more than 3.0 eV.

$$T_1^A - S_1 > 0.2 \text{ eV} \quad (1)$$

$$|LUMO^A| > 1.9 \text{ eV} \quad (3)$$

The structure of the acceptor compound is not specifically defined so far as the compound satisfies the above-mentioned conditions, and preferred examples of the acceptor compound are the compounds represented by the following formulae [1] to [4]:

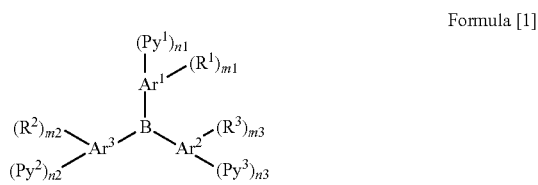

Formula [1]

In the formula [1], $Ar^1$, $Ar^2$ and $Ar^3$ each independently represent an aromatic hydrocarbon ring. $Ar^1$, $Ar^2$ and $Ar^3$ may be the same or different, but are preferably the same. The aromatic hydrocarbon ring to be represented by $Ar^1$, $Ar^2$ and $Ar^3$ preferably has from 1 to 22 carbon atoms, more preferably from 1 to 14 carbon atoms, even more preferably from 1 to 10 carbon atoms. For example, there may be mentioned a benzene ring, a naphthalene ring, an anthracene ring, a phenanthrene ring, etc. Preferred are a benzene ring and a naphthalene ring; and more preferred is a benzene ring.

In the formula [1], $R^1$, $R^2$ and $R^3$ each independently represent a substituted or unsubstituted alkyl group, or a substituted or unsubstituted alkoxy group. $R^1$, $R^2$ and $R^3$ may be the same or different, but are preferably the same. $R^1$, $R^2$ and $R^3$ each bond to the aromatic hydrocarbon rings of $Ar^1$, $Ar^2$ and $Ar^3$, respectively, each as the substituent of the ring.

The alkyl group to be represented by $R^1$, $R^2$ and $R^3$ may be linear, branched or cyclic. Preferred is a linear or branched alkyl group. The carbon number of the alkyl group is preferably from 1 to 20, more preferably from 1 to 12, even more preferably from 1 to 6, still more preferably from 1 to 3 (or that is, the alkyl group is a methyl group, an ethyl group, an n-propyl group or an isopropyl group). The cyclic alkyl group includes, for example, a cyclopentyl group, a cyclohexyl group, a cycloheptyl group. The alkyl group to be represented by $R^1$, $R^2$ and $R^3$ may be substituted, and in the substituted case, the substituent includes an alkoxy group, an aryl group, an aryloxy group. For the description and the preferred range of the alkoxy group, referred to is the description of the alkoxy group given below to be represented by $R^1$, $R^2$ and $R^3$. The aryl group may have a structure of one aromatic group or a structure of two or more condensed aromatic rings. The carbon number of the aryl group is preferably from 6 to 22, more preferably from 6 to 18, even more preferably from 6 to 14, still more preferably from 6 to 10 (or that is, the aryl group is a phenyl group, a 1-naphthyl group, a 2-naphthyl group). The aryloxy group may have a structure of one aromatic ring or a structure of two or more condensed aromatic rings. The carbon number of the aryloxy group is preferably from 6 to 22, more preferably from 6 to 18, even more preferably from 6 to 14, still more preferably from 6 to 10 (or that is, the aryloxy group is a phenyloxy group, a 1-naphthyloxy group, a 2-naphthyloxy group).

The alkoxy group to be represented by $R^1$, $R^2$ and $R^3$ may be linear, branched or cyclic. Preferred is a linear or branched alkoxy group. The carbon number of the alkoxy group is preferably from 1 to 20, more preferably from 1 to 12, even more preferably from 1 to 6, still more preferably from 1 to 3 (or that is, the alkoxy group is a methoxy group, an ethoxy group, an n-propoxy group, an isopropoxy group). The cyclic alkoxy group includes, for example, a cyclopentyloxy group, a cyclohexyloxy group, a cycloheptyloxy group. The alkoxy group to be represented by $R^1$, $R^2$ and $R^3$ may be substituted, and in the substituted case, the substituent includes an alkoxy group, an aryl group, an aryloxy group. For the description and the preferred range of the alkoxy group, the aryl group and the aryloxy group, referred to is the above-mentioned description.

In the formula [1], m1, m2 and m3 each independently indicate an integer of from 0 to 4, preferably an integer of from 0 to 3. For example, in the case where $Ar^1$, $Ar^2$ and $Ar^3$ each are a benzene ring, the compound is a tri-substituted compound at the 2-, 4- and 6-positions thereof, or a di-substituted compound at the 3- and 5-positions thereof, or a mono-substituted compound at the 2-position thereof, or a mono-substituted compound at the 3-position thereof, or a mono-substituted compound at the 4-position thereof. m1, m2 and m3 may be the same or different, but are preferably the same. In the case where m1 is 2 or more, plural $R^1$'s existing in the molecule may be the same or different. The same shall apply to m2 and m3.

In the formula [1], $Py^1$, $Py^2$ and $Py^3$ each independently represent a substituted or unsubstituted pyridyl group. $Py^1$, $Py^2$ and $Py^3$ may be the same or different, but are preferably the same. $Py^1$, $Py^2$ and $Py^3$ each bond to the aromatic hydrocarbon rings of $Ar^1$, $Ar^2$ and $Ar^3$, respectively, each as the substituent of the ring. The pyridyl group to be represented by $Py^1$, $Py^2$ and $Py^3$ includes a 2-pyridyl group, a 3-pyridyl group, a 4-pyridyl group; and any of which is preferred here. Above all, more preferred is a 3-pyridyl group. The pyridyl group may be further substituted or may not be substituted. In the case where the pyridyl group is substituted, the substituent includes, for example, an alkyl group, an alkoxy group. For the description and the preferred range of the groups, referred to is the corresponding description of $R^1$, $R^2$ and $R^3$.

In the formula [1], n1, n2 and n3 each independently indicate an integer of from 1 to 3, and preferably 1 or 2. For example, in the case where $Ar^1$, $Ar^2$ and $Ar^3$ each are a benzene ring, the compound includes a mono-substituted compound at the 3-position thereof, and a di-substituted compound at the 3- and 5-positions thereof. n1, n2 and n3 may be the same or different, but are preferably the same. In the case where n1 is 2 or more, plural $Py_1$'s in the molecule may be the same or different. The same shall apply to n2 and n3.

Formula [2]

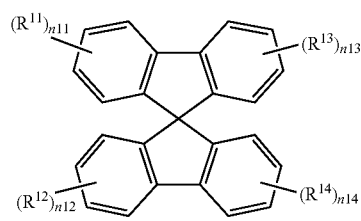

In the formula [2], $R^{11}$, $R^{12}$, $R^{13}$ and $R^{14}$ each independently represent

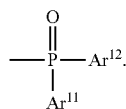

$Ar^{11}$ and $Ar^{12}$ each independently represent a substituted or unsubstituted aryl group. $Ar^{11}$ and $Ar^{12}$ may be the same or different, but are preferably the same. For the description and the preferred range of the substituted or unsubstituted aryl group, for example, referred to is the corresponding description of the formula [1]. For example, $Ar^{11}$ and $Ar^{12}$ each are preferably a phenyl group. $R^{11}$, $R^{12}$, $R^{13}$ and $R^{14}$ may be the same or different, but are preferably the same.

In the formula [2], n11, n12, n13 and n14 each independently indicate an integer of from 0 to 2, preferably 0 or 1. The sum total of n11, n12, n13 and n14 is at least 1, preferably from 1 to 4, more preferably 1 or 2. In the case where the sum total is 2 or more, plural groups in the molecule of the following:

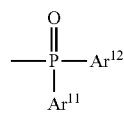

may be the same or different, but are preferably the same.

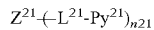 Formula [3]

In the formula [3], $Z^{21}$ represents a structure of any of the following:

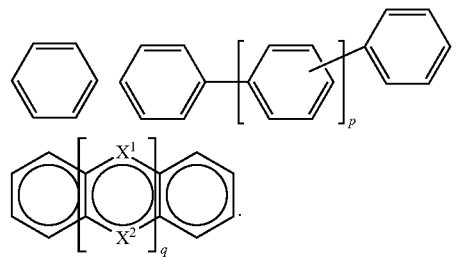

$X^1$ and $X^2$ are both —CH═, or $X^1$ is a single bond and $X^2$ is —CH═CH—, or $X^1$ is —CH═CH— and $X^2$ is a single bond. The ring skeleton containing $X^1$ and $X^2$ constitutes the benzene ring. p indicates an integer of from 0 to 3, and may be for example 0 or 1. q indicates an integer of from 0 to 3, and may be for example 0 or 1.

In the formula [3], $L^{21}$ represents a substituted or unsubstituted arylene group. The arylene group may have a structure of one aromatic group or a structure of two or more condensed aromatic groups. The carbon number of the arylene group is preferably from 6 to 22, more preferably from 6 to 18, even more preferably from 6 to 14, still more preferably from 6 to 10. Even more preferred are a 1,3-phenylene group, a 1,4-phenylene group, a 1,5-naphthylene group, a 2,6-naphthylene group; and still more preferred are a 1,3-phenylene group and a 1,4-phenylene group. In the case where the arylene group is substituted, the substituent includes an alkyl group, an alkoxy group, an aryl group, an aryloxy group. For the description and the preferred range of these groups, referred to is the corresponding description of the formula [1].

In the formula [3], $Py^{21}$ represents a substituted or unsubstituted pyridyl group. For the description and the preferred range of the substituted or unsubstituted pyridyl group, referred to is the corresponding description of the formula [1].

In the formula [3], n21 indicates an integer of from 2 to 6, preferably from 2 to 4, more preferably 3 or 4. Plural ($L^{21}$-$Py^{21}$)'s existing in the molecule may be the same or different, but are preferably the same.

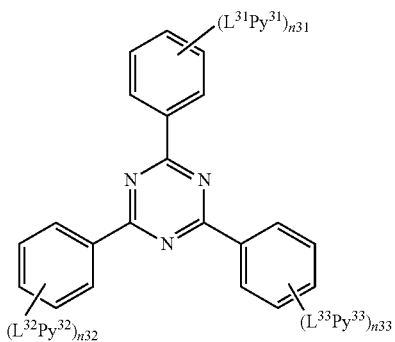

Formula [4]

In the formula [4], $L^{31}$, $L^{32}$ and $L^{33}$ each independently represent a single bond or a substituted or unsubstituted arylene group. $L^{31}$, $L^{32}$ and $L^{33}$ may be the same or different but are preferably the same. For the description and the preferred range of the substituted or unsubstituted arylene group, referred to is the corresponding description of the formula [3]. For example, a 1,3-phenylene group may be employed here.

In the formula [4], $Py^{31}$, $Py^{32}$ and $Py^{33}$ each independently represent a substituted or unsubstituted pyridyl group. $Py^{31}$, $Py^{32}$ and $Py^{33}$ may be the same or different but are preferably the same. For the description and the preferred range of the substituted or unsubstituted pyridyl group, referred to is the corresponding description of the formula [1].

In the formula [4], n31, n32 and n33 each independently indicate an integer of from 1 to 3, preferably 1 or 2. For example, the compound includes a tri-substituted compound at the 2-, 4- and 6-positions thereof, a di-substituted compound at the 3- and 5-positions thereof, a mono-substituted compound at the 3-position thereof, and a mono-substituted compound at the 4-position thereof. n31, n32 and n33 may be the same or different but are preferably the same. When n31 is 2 or more, plural ($L^{31}$-$Py^{31}$)'s existing in the molecule may be the same or different but are preferably the same. The same shall apply to n32 and n33.

The acceptor compound for use in the invention is commercially available or may be produced according to known methods, as combined if necessary.

Specific examples of compounds preferred for use as the acceptor compound in the invention are mentioned below. Of the following compounds, more preferred are the compound 1, the compound 2, the compound 6 and the compound 7; even more preferred are the compound 1 and the compound 2; and still even more preferred is the compound 1. The range of the acceptor compound for use in the invention should not be limitatively interpreted by the following specific examples.

1.

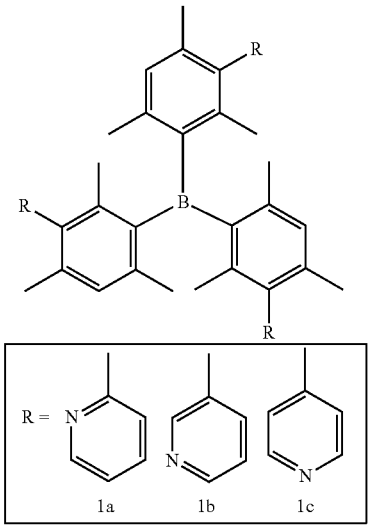

2.

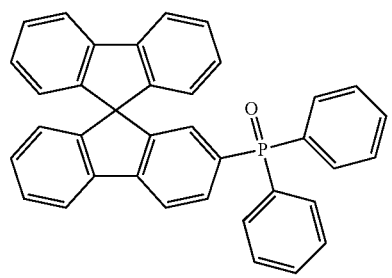

3.

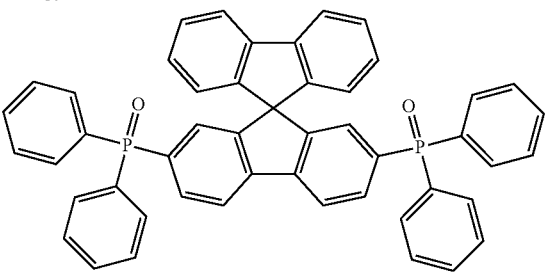

4.

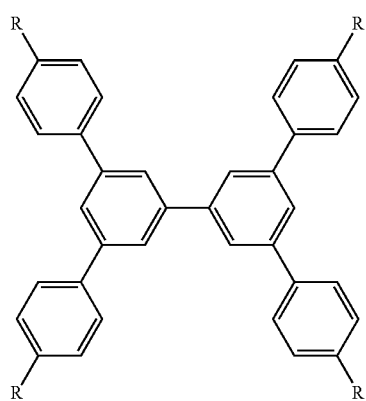

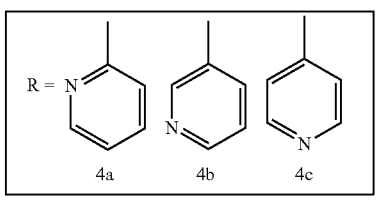

5.

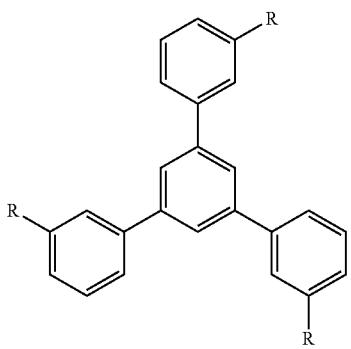

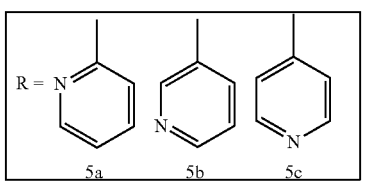

6.

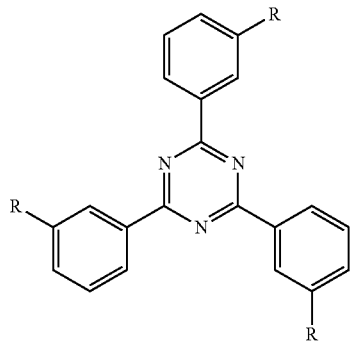

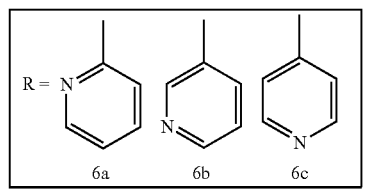

7.

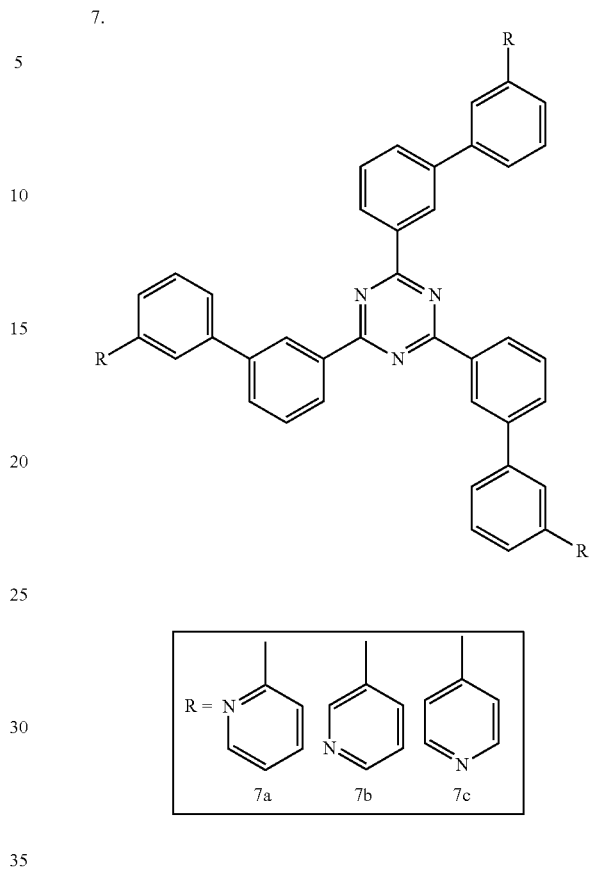

[Donor Compound]

The donor compound to constitute the exciplex in the invention is a compound that satisfies the conditions of the formula (2) and the formula (4). Specifically, the excited triplet energy ($T_1^D$) defined by the peak wavelength on the short wavelength side in the phosphorescence spectrum of the donor compound is larger than the excited singlet energy ($S_1$) of the exciplex defined by the peak wavelength of the exciplex light emission, and the difference therebetween must be at least 0.2 eV. Preferably, the difference between the excited triplet energy ($T_1^D$) of the donor compound and the excited singlet energy ($S_1$) of the exciplex is more than 0.3 eV, even more preferably more than 0.4 eV. In addition, the energy level of HOMO of the donor compound ($|HOMO^D|$) must be not more than 5.3 eV, and is preferably less than 5.2 eV, more preferably less than 5.1 eV.

$$T_1^D - S_1 \geq 0.2 \text{ eV} \quad (2)$$

$$|HOMO^D| \leq 5.3 \text{ eV} \quad (4)$$

The structure of the donor compound is not specifically defined so far as the compound satisfies the above-mentioned conditions, and preferred examples of the donor compound are the compounds represented by the following formulae [11] to [13]:

Formula [11]

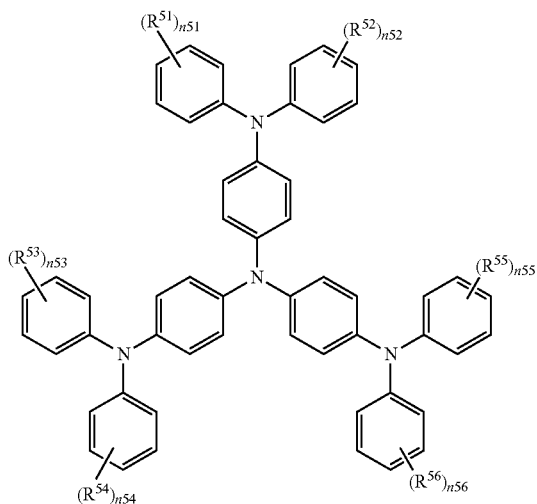

In the formula [11], $R^{51}$, $R^{52}$, $R^{53}$, $R^{54}$, $R^{55}$ and $R^{56}$ each independently represent a substituted or unsubstituted alkyl group, or a substituted or unsubstituted alkoxy group. $R^{51}$, $R^{52}$, $R^{53}$, $R^{54}$, $R^{55}$ and $R^{56}$ may be the same or different but are preferably the same. For the description and the preferred range of the substituted or unsubstituted alkyl group and the substituted or unsubstituted alkoxy group, referred to is the corresponding description of the formula [1].

In the formula [11], n51, n52, n53, n54, n55 and n56 each independently indicate an integer of from 0 to 5, preferably from 0 to 3, more preferably from 0 to 2. n51, n52, n53, n54, n55 and n56 may be the same or different; but preferably n51, n53 and n55 are the same and n52, n54 and n56 are the same. For example, preferred are cases where n51, n53 and n55 are 1 or 2, and n52, n54 and n56 are 0. Regarding the substituent configuration thereof, the compound includes, for example, a tri-substituted compound at the 2-, 4- and 6-positions thereof, a di-substituted compound at the 3- and 5-positions thereof, a mono-substituted compound at the 2-position thereof, a mono-substituted compound at the 3-position thereof, and a mono-substituted compound at the 4-position thereof. In the case where n51 is 2 or more, plural $R^{51}$'s existing in the molecule may be the same or different but are preferably the same. In the case where two of plural $R^{51}$'s existing in the molecule bond to the neighboring carbon atoms of the benzene ring, the two $R^{51}$'s may bond to each other to form a linking group. The two $R^{51}$'s bonding to each other to form a linking group form a ring condensed with the benzene ring. Preferably, the carbon number of the linking group to be formed by bonding of the two $R^{51}$'s to each other is from 3 to 5, more preferably 3 or 4. The linking group includes, for example, an alkylene group, and an alkenylene group. Preferred examples of the linking group are —CH=CH—CH=CH— and its derivatives where at least one of the four hydrogen atoms is substituted with a substituted or unsubstituted alkyl group, or a substituted or unsubstituted alkoxy group. For the description and the preferred range of the substituted or unsubstituted alkyl group and the substituted or unsubstituted alkoxy group, referred to is the corresponding description of the formula [1]. Regarding the description of n51, the same shall apply also to n52, n53, n54, n55 and n56.

Formula [12]

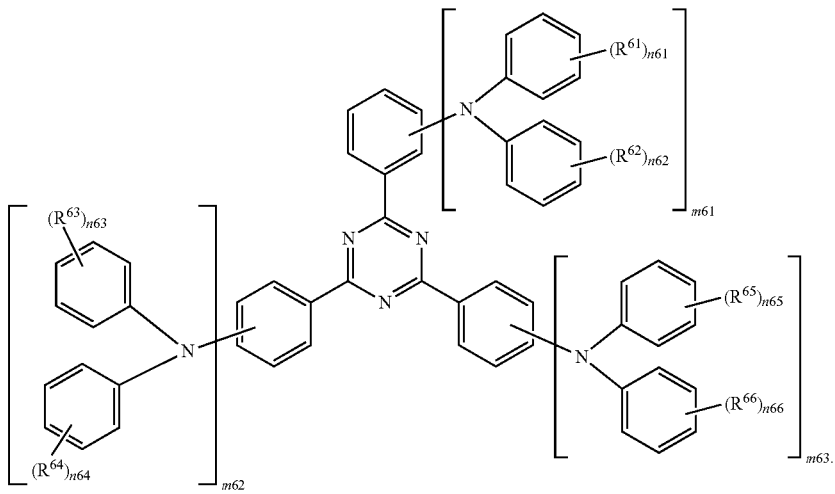

In the formula [12], $R^{61}$, $R^{62}$, $R^{63}$, $R^{64}$, $R^{65}$ and $R^{66}$ each independently represent a substituted or unsubstituted alkyl group, or a substituted or unsubstituted alkoxy group. $R^{61}$, $R^{62}$, $R^{63}$, $R^{64}$, $R^{65}$ and $R^{66}$ may be the same or different but are preferably the same. For the description and the preferred range of the substituted or unsubstituted alkyl group and the substituted or unsubstituted alkoxy group, referred to is the corresponding description of the formula [1].

In the formula [12], m61, m62 and m63 each independently indicate 1 or 2. For example, the compound includes a di-substituted compound at the 3- and 5-positions thereof, a mono-substituted compound at the 3-position thereof, and a mono-substituted compound at the 4-position thereof. In the case where m61 is 2 or more, plural groups in the molecule of the following:

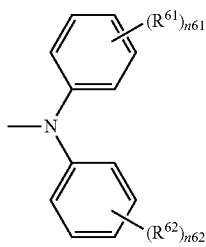

may be the same or different, but are preferably the same. The same shall apply to m62 and m63. m61, m62 and m63 may be the same or different but are preferably the same.

In the formula [12], n61, n62, n63, n64, n65 and n66 each independently indicate an integer of from 0 to 5, preferably from 0 to 3, more preferably from 0 to 2. For example, the compound includes a tri-substituted compound at the 2-, 4- and 6-positions thereof, a di-substituted compound at the 3- and 5-positions thereof, a mono-substituted compound at the 2-position thereof, a mono-substituted compound at the 3-position thereof, and a mono-substituted compound at the 4-position thereof. In the case where n61 is 2 or more, plural $R^{61}$'s existing in the molecule may be the same or different, but are preferably the same. In the case where two of plural $R^{61}$'s existing in the molecule bond to the neighboring carbon atoms of the benzene ring, the two $R^{61}$'s may bond to each other to form a linking group. The two $R^{61}$'s bonding to each other to form a linking group form a ring condensed with the benzene ring. Preferably, the carbon number of the linking group to be formed by bonding of the two $R^{61}$'s to each other is from 3 to 5, more preferably 3 or 4. The linking group includes, for example, an alkylene group, and an alkenylene group. Preferred examples of the linking group are —CH=CH—CH=CH— and its derivatives where at least one of the four hydrogen atoms is substituted with a substituted or unsubstituted alkyl group, or a substituted or unsubstituted alkoxy group. For the description and the preferred range of the substituted or unsubstituted alkyl group and the substituted or unsubstituted alkoxy group, referred to is the corresponding description of the formula [1]. Regarding the description of n61, the same shall apply also to n62, n63, n64, n65 and n66. n61, n62, n63, n64, n65 and n66 may be the same or different but are preferably the same.

Formula [13]

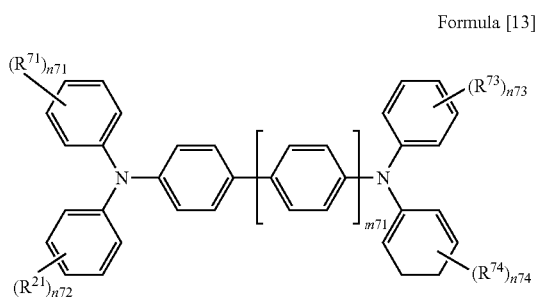

In the formula [13], $R^{71}$, $R^{72}$, $R^{73}$ and $R^{74}$ each independently represent a substituted or unsubstituted alkyl group, a substituted or unsubstituted alkoxy group, or the following group:

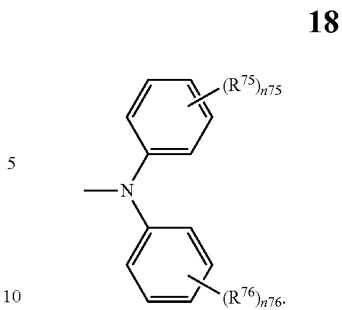

$R^{75}$ and $R^{76}$ each independently represent a substituted or unsubstituted alkyl group, or a substituted or unsubstituted alkoxy group. For the description and the preferred range of the substituted or unsubstituted alkyl group and the substituted or unsubstituted alkoxy group to be represented by $R^{71}$, $R^{72}$, $R^{73}$, $R^{74}$, $R^{75}$ and $R^{76}$ referred to is the corresponding description of the formula [1]. $R^{71}$, $R^{72}$, $R^{73}$ and $R^{74}$ may be the same or different but are preferably the same.

In the formula [13], m71 indicates 0 or 1, any of which is preferred here.

In the formula [13], n71, n72, n73, n74, n75 and n76 each independently indicate an integer of from 0 to 5, preferably from 0 to 3, more preferably from 0 to 2. For example, the compound includes a tri-substituted compound at the 2-, 4- and 6-positions thereof, a di-substituted compound at the 3- and 5-positions thereof, a mono-substituted compound at the 2-position thereof, a mono-substituted compound at the 3-position thereof, and a mono-substituted compound at the 4-position thereof. In the case where n71 is 2 or more, plural $R^{71}$'s existing in the molecule may be the same or different, but are preferably the same. In the case where two of plural $R^{71}$'s existing in the molecule bond to the neighboring carbon atoms of the benzene ring, the two $R^{71}$'s may bond to each other to form a linking group. The two $R^{71}$'s bonding to each other to form a linking group form a ring condensed with the benzene ring. Preferably, the carbon number of the linking group to be formed by bonding of the two $R^{71}$'s to each other is from 3 to 5, more preferably 3 or 4. The linking group includes, for example, an alkylene group, and an alkenylene group. Preferred examples of the linking group are —CH=CH—CH=CH— and its derivatives where at least one of the four hydrogen atoms is substituted with a substituted or unsubstituted alkyl group, or a substituted or unsubstituted alkoxy group. For the description and the preferred range of the substituted or unsubstituted alkyl group and the substituted or unsubstituted alkoxy group, referred to is the corresponding description of the formula [1]. Regarding the description of n71, the same shall apply also to n72, n73, n74, n75 and n76. n71, n72, n73 and n74 may be the same or different, but are preferably the same. n75 and n76 may be the same or different, but are preferably the same.

The donor compound for use in the invention is commercially available or may be produced according to known methods, as combined if necessary.

Specific examples of compounds preferred for use as the acceptor compound in the invention are mentioned below. Of the following compounds, more preferred are the compound 8, the compound 9 and the compound 10; even more preferred are the compound 8 and the compound 9; and still even more preferred is the compound 8. The range of the donor compound for use in the invention should not be limitatively interpreted by the following specific examples.

8.
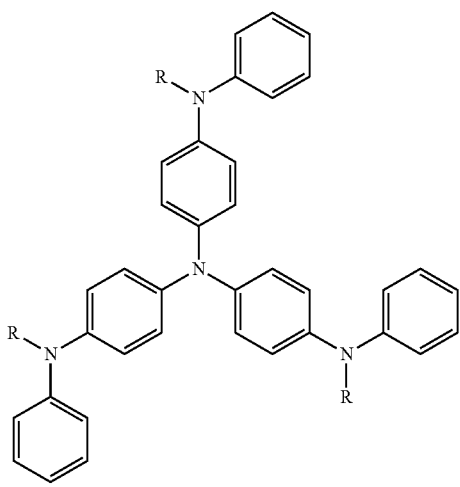
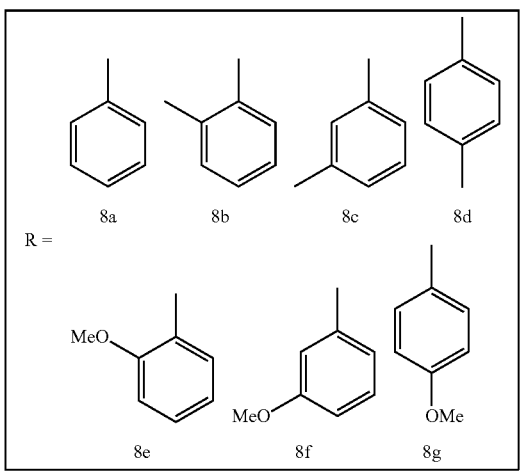
9.
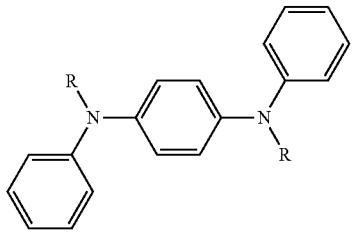
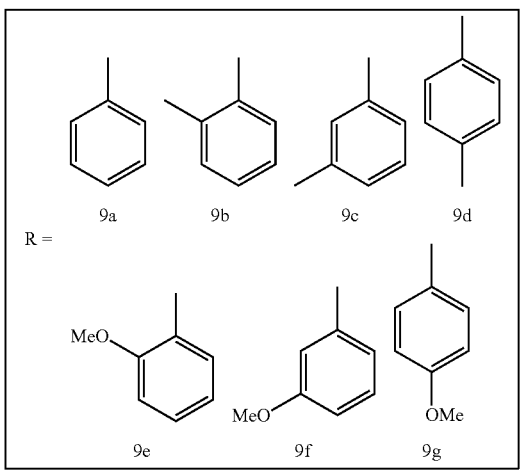
10.
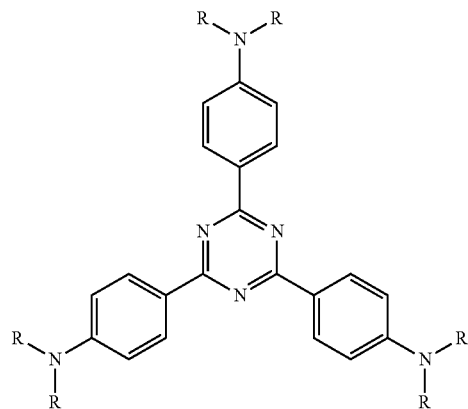
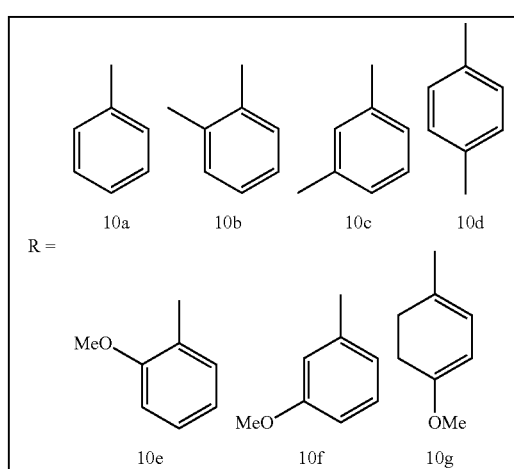
11.
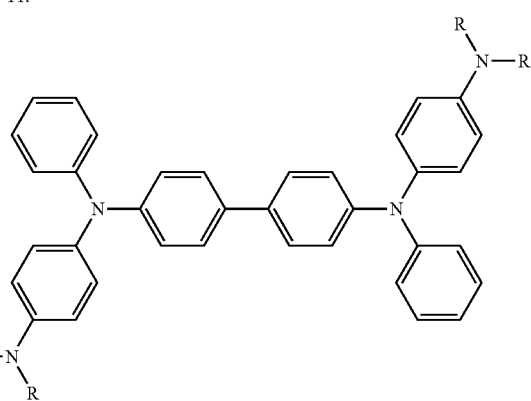

-continued

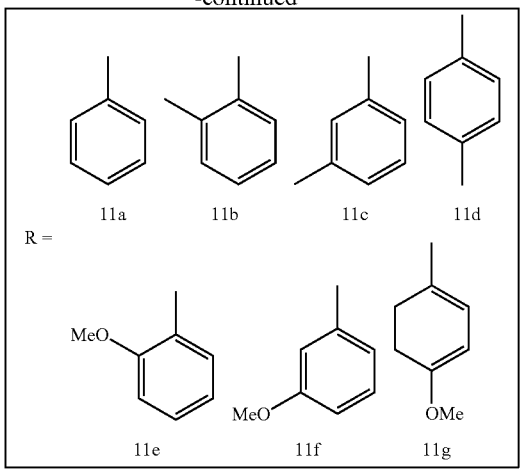

12.

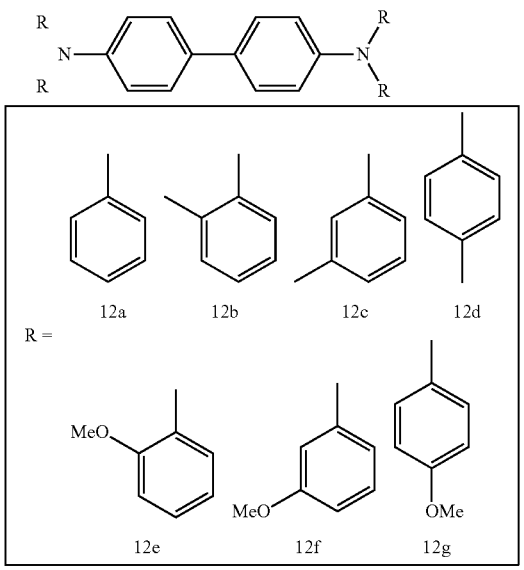

[Mixture of Acceptor Compound and Donor Compound]

In the invention, the acceptor compound and the donor compound are mixed to give a mixture. In the mixture, the molar content of the donor compound in the mixture (donor compound/sum of acceptor compound and donor compound) is preferably from more than 0.2 to less than 0.6, more preferably from more than 0.3 to less than 0.6, even more preferably from more than 0.4 to less than 0.6.

Not specifically defined, the combination of the acceptor compound and the donor compound may be any one capable of forming an exciplex and satisfying the conditions of the formulae (1) to (4). Preferred combinations of the acceptor compound and the donor compound are shown in the following Table. More preferred combinations are the following Nos. 1, 3, 8, 11 and 18.

TABLE 1

| Number of Exciplex | Acceptor Compound | Donor Compound |
|---|---|---|
| 1 | 1b | 8a |
| 2 | 1b | 8b |
| 3 | 1b | 8c |
| 4 | 1b | 8d |
| 5 | 1b | 8e |

TABLE 1-continued

| Number of Exciplex | Acceptor Compound | Donor Compound |
|---|---|---|
| 6 | 1b | 8f |
| 7 | 1b | 9a |
| 8 | 1b | 9c |
| 9 | 1b | 9d |
| 10 | 1b | 9f |
| 11 | 1b | 9g |
| 12 | 1b | 12c |
| 13 | 1b | 13g |
| 14 | 1a | 8c |
| 15 | 1c | 8c |
| 16 | 2 | 8a |
| 17 | 2 | 8b |
| 18 | 2 | 8c |
| 19 | 2 | 8d |
| 20 | 2 | 8e |
| 21 | 2 | 9c |
| 22 | 2 | 12c |
| 23 | 2 | 13g |

The shape of the mixture of the acceptor compound and the donor compound may be determined in consideration of the use and the service environment of the mixture. One typical shape is a film. In the case where the film of the mixture is used as a delayed fluorescence material (light-emitting layer), the thickness thereof may be generally within a range of from 20 to 200 nm, preferably from 20 to 100 nm, more preferably from 20 to 80 nm. The forming method is not specifically defined. For example, herein employable is a co-evaporation coating method.

The mixture of the acceptor compound and the donor compound satisfying the conditions of the invention is useful as a delayed fluorescence material. Since the mixture satisfies the above-mentioned conditions (1) to (4), the delayed fluorescence from the exciplex can be observed strongly. The delayed fluorescence material of the invention can effectively generate delayed fluorescence, taking advantage of the process of reverse intersystem crossing thereof, and therefore enables more than 5% external quantum efficiency at an exciton formation efficiency of from 25 to 100%.

[Organic Electroluminescence Device]

The mixture of the acceptor compound and the donor compound of the invention is useful as a delayed fluorescence material, and therefore, the mixture can be effectively used in the light-emitting layer of an organic electroluminescence device.

A typical organic electroluminescence device has a structure of an anode such as ITO or the like, a hole injection layer, a hole transportation layer, a light-emitting layer, an electron transportation layer, an electron injection layer and a cathode laminated on a transparent substrate such as glass or the like. A part of the layers except the electrodes and the light-emitting layer may be omitted. The materials for the layers and the electrodes except the light-emitting layer may be suitably selected from known ones and may be optimized. In the invention, preferably, the light emitting layers are laminated between a layer that contains the acceptor compound used in the light-emitting layer and a layer that contains the donor compound used in the light-emitting layer. The method of forming the layers and the electrodes constituting the organic electroluminescence device may be suitably selected from known ones. The organic electroluminescence device of the invention may be variously modified according to known techniques or in any manner that could be easily anticipated from known techniques.

EXAMPLES

The characteristics of the invention are described more concretely with reference to the following Examples. In the following Examples, the material used, its amount and ratio, the details of the treatment and the treatment process may be suitably modified or changed not overstepping the spirit and the scope of the invention. Accordingly, the invention should not be limitatively interpreted by the Examples mentioned below.

Example 1

(1) Production of Samples 1 to 3

Samples 1 to 3 were produced according to the method mentioned below.

[Sample 1]

On a silicon substrate, 4,4',4''-tris[3-methylphenyl(phenyl)amino]triphenylamine (m-MTDATA: compound 8c) was vacuum-deposited in a thickness of 100 nm to produce a sample 1.

[Sample 2]

On a silicon substrate, tris(2,4,6-trimethyl-3-(pyridin-3-yl)phenyl)borane (3TPYMB: compound 1b) was vacuum-deposited in a thickness of 100 nm to produce a sample 2.

[Sample 3]

On a silicon substrate, 3TPYMB doped with 50 mol % m-MTDATA was co-deposited in a thickness of 100 nm to produce a sample 3.

(2) Analysis of Sample 1 and Sample 2

[Determination of Excited Triplet Energy]

Using a streak camera, the phosphorus spectra of the sample 1 and the sample 2 were taken. As the excitation light source, used as a nitrogen gas laser at a wavelength of 337 nm. Using a cryostat, the sample was cooled to a temperature of 10K, and analyzed. In the phosphorus spectrum thus taken, the energy at the peak wavelength observed on the shortest wavelength side was taken as the triplet energy of the sample.

[Determination of Energy Level of HOMO]

Using a photoelectron spectrometer, the energy level of HOMO of the sample 1 and the sample 2 was measured.

[Determination of Energy Level of LUMO]

Using a spectrophotometer, the absorption end energy of the sample 1 and the sample 2 was measured, and this was defined as the energy gap. The position higher than the energy level of HOMO by the measured energy gap was taken as the energy level of LUMO.

[Measurement Results]

The measurement results are shown in Table 2.

TABLE 2

| | Excited Triplet Energy | HOMO Energy Level | LUMO Energy Level |
|---|---|---|---|
| Sample 1 (m-MTDATA) | 2.6 eV | 5.1 eV | 2.0 eV |
| Sample 2 (3TPYMB) | 2.8 eV | 6.8 eV | 3.4 eV |

(3) Analysis of Sample 3

[Measurement of Excited Simplex Energy of Exciplex and Result]

Using a fluorescence spectrometer, the luminescence spectrum of the sample 3 was measured.

FIG. 1 shows the result. The co-deposition film of the sample 3 gave light emission on the long wavelength side differing from that of the single-layer film of the sample 1 and the sample 2. The light emission peak wavelength observed by the exciplex formation between m-MTDATA and 3TPYMB showed 537 nm, from which the excited singlet energy of the exciplex could be estimated as 2.3 eV.

[Confirmation and Result of Delayed Fluorescence]

The delayed fluorescence of the sample 3 was confirmed through time-resolved photoluminescence (PL) spectrometry using a streak camera. As the excitation light source, used was a nitrogen gas laser at a wavelength of 337 nm.

Figure 2:
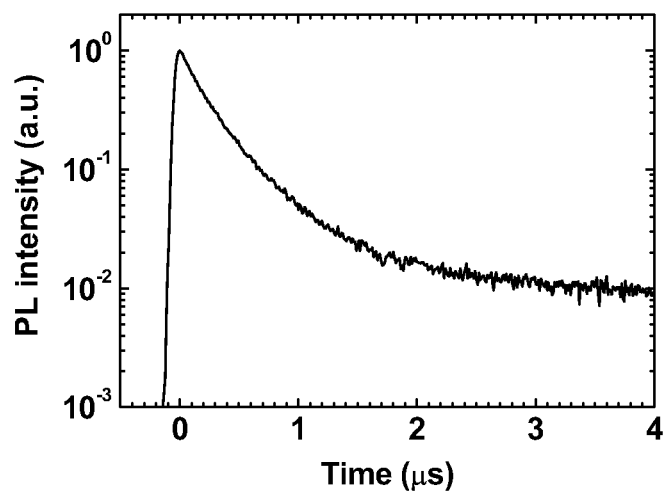
FIG. 2 shows a time-resolved PL spectrum of the sample 3 in Example 1.

The result is shown in FIG. 2. At around the time of 0 μs, strong light emission of the fluorescence ingredient of the exciplex was admitted, and delayed fluorescence through up-conversion from the excited triplet state to the excited single state was observed as the delayed light emission ingredient.

Example 2

Figure 3:
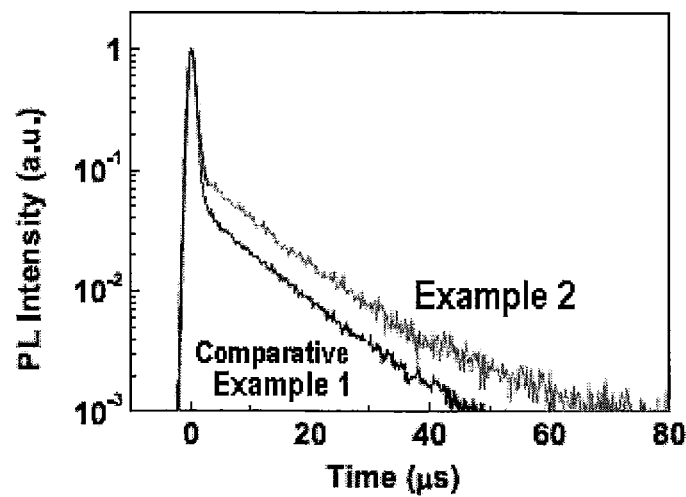
FIG. 3 shows time-resolved PL spectra of Example 2 and Comparative Example 1.

Samples were produced according to the same process as in Example 1 except that SPPO1 (compound 2) was used as the acceptor compound in place of 3TPYMB (compound 1b). The excited triplet energy of the sample 2 (SPPO1) was 2.9 eV, the energy level of HOMO was 6.5 eV, and the energy level of LUMO was 2.7 eV. The excited singlet energy of the exciplex of the sample 3 was 2.4 eV. FIG. 3 shows the time-resolved PL spectrum.

Comparative Example 1

Samples were produced according to the same process as in Example 1 except that t-BuPBD mentioned below was used as the acceptor compound in place of 3TPYMB (compound 1b). The excited triplet energy of the sample 2 (t-BuPBD) was 2.4 eV, the energy level of HOMO was 6.1 eV, and the energy level of LUMO was 2.4 eV. The excited singlet energy of the exciplex of the sample 3 was 2.3 eV. FIG. 3 shows the time-resolved PL spectrum.

t-BuPBD

Examples 3 to 5

Samples were produced and measured according to the same process as in Example 1 except that the acceptor and the donor shown in Table 3 were used. The results are shown in Table 3 and FIGS. 4 to 6.

TABLE 3

Figure 4:
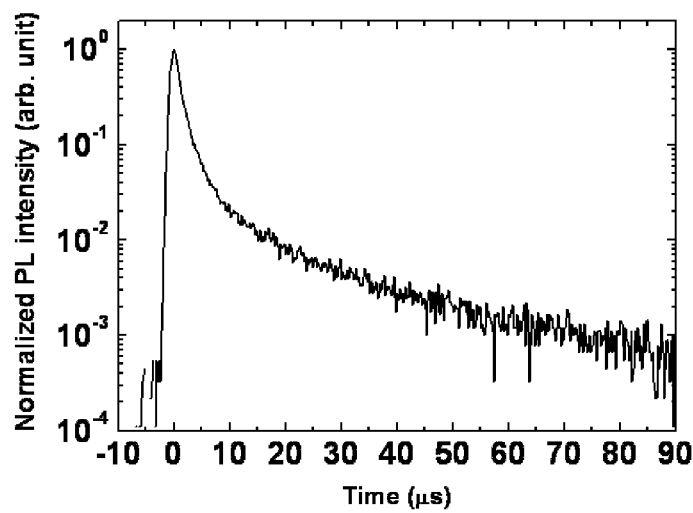
FIG. 4 shows a time-resolved PL spectrum of Example 3.
Figure 5:
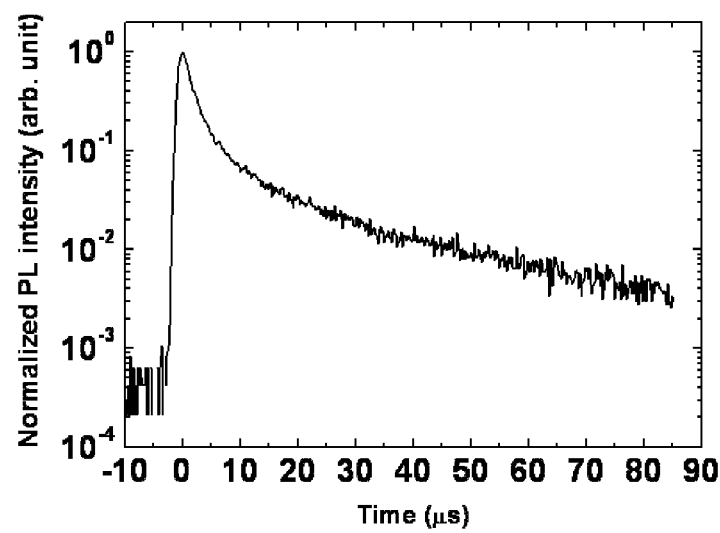
FIG. 5 shows a time-resolved PL spectrum of Example 4.
Figure 6:
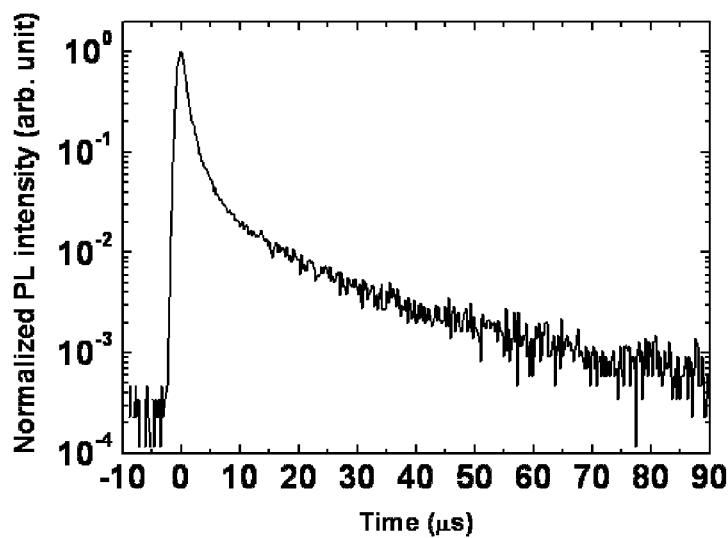
FIG. 6 shows a time-resolved PL spectrum of Example 5.
Figure 7:
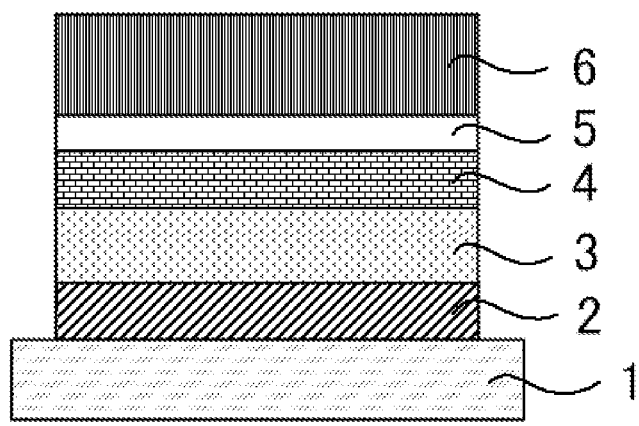
FIG. 7 is a schematic cross-sectional view showing the layer configuration of the organic EL device of Example 6 in which 1 is glass, 2 is hole injection layer, 3 is light-emitting layer, 4 is electron transportation layer, 5 is metal electrode, and 6 is aluminum.

| | Compound No. | | Measured Data | | | | | | | time-resolved PL spectrum |
|---|---|---|---|---|---|---|---|---|---|---|
| | Acceptor | Donor | $T_1^A$ | $T_1^D$ | $LUMO^A$ | $HOMO^D$ | $S_1$ | $T_1^A - S_1$ | $T_1^D - S_1$ | |
| Example 1 | 1b | 8c | 2.8 | 2.6 | 3.4 | 5.1 | 2.3 | 0.5 | 0.3 | FIG. 2 |
| Example 2 | 2 | 8c | 2.9 | 2.6 | 2.7 | 5.1 | 2.4 | 0.5 | 0.2 | FIG. 3 |
| Comparative Example 1 | t-BuPBD | 8c | 2.4 | 2.6 | 2.4 | 5.1 | 2.3 | 0.1 | 0.3 | FIG. 3 |
| Example 3 | 1b | 9g | 2.8 | 2.7 | 3.4 | 5.3 | 2.4 | 0.4 | 0.3 | FIG. 4 |
| Example 4 | 1b | 8a | 2.8 | 2.6 | 3.4 | 5.2 | 2.3 | 0.5 | 0.3 | Fog. 5 |
| Example 5 | 1b | 9c | 2.8 | 2.7 | 3.4 | 5.3 | 2.5 | 0.3 | 0.2 | FIG. 6 |

Example 6

In this Example, an organic electroluminescence device was produced and its light emission efficiency was determined.

Figure 8:
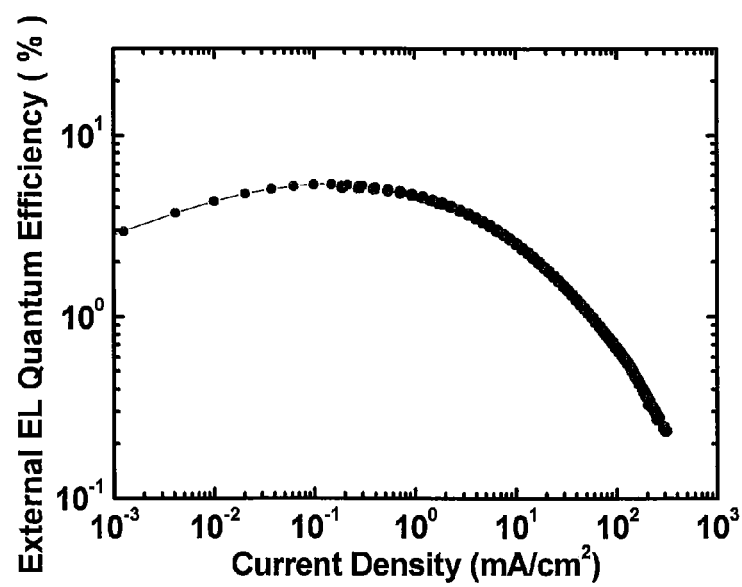
FIG. 8 is a graph showing the external EL quantum efficiency of the organic EL device of Example 6.

(1) Production or Organic Electroluminescence Device:

An indium tin oxide (ITO) film having a thickness of about 100 nm was formed on the glass 1, and m-MTDATA was vacuum-deposited in a thickness of 20 nm thereon as a hole injection layer 2. Next, as a light-emitting layer 3, 3TPYMB doped with 50 mol % m-MTDATA was co-deposited thereon in a thickness of 60 nm. Further, as an electron transportation layer 4, 3TPYMB was vacuum-deposited therein in a thickness of 20 nm. Finally, as a metal electrode 5, lithium fluoride (LiF) was vacuum-deposited in a thickness of 0.5 nm, and thereafter aluminum 6 was deposited in a thickness of 50 nm, thereby producing an organic electroluminescence device having the layer configuration shown in FIG. 8.

(2) Evaluation of Light Emission Efficiency:

Using a semiconductor parameter analyzer and a power meter, the device was analyzed for the current-voltage-luminescence (J-V-L) characteristic thereof. The EL spectrum was measured with a multichannel spectrometer. From the results, the external EL quantum efficiency was computed.

Figure 9:
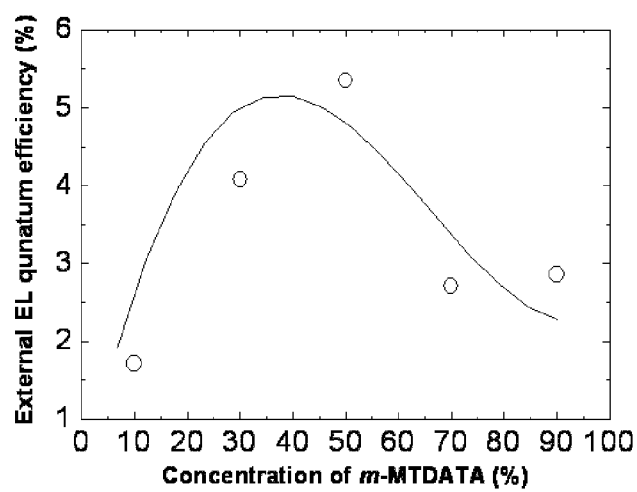
FIG. 9 is a graph showing the correlation of the external EL quantum efficiency and the composition of the light-emitting layer of the organic EL device of Example 7.

FIG. 9 shows the result. As compared with the theoretical limitation 5% of the external EL quantum efficiency in the device using a fluorescent material in the light-emitting layer thereof, the light emitting layer of the organic electroluminescence device of the invention showed about 7% higher light emission efficiency.

Example 7

In this Example, the correlation of the composition of the light-emitting layer and the external EL quantum efficiency of the organic electroluminescence device is determined.

Samples were produced and their external EL quantum efficiencies were measured according to the same process as in Example 6 except that the amount of the dope (3TPYMB) in the light-emitting layer 3 was changed to 10, 30, 70 and 90 mol %. The results are shown in FIG. 9.

INDUSTRIAL APPLICABILITY

The delayed fluorescence material of the invention has high light emission efficiency and can be applied to various industrial products. For example, the material is expected to be useful in the field of display devices such as organic electroluminescence devices, as well as other displays, backlights, electrophotographic systems, light sources for lighting, light sources for photoexposure, light sources for reading, marks, signs, interiors, etc. Accordingly, the industrial applicability of the invention is great.

While the present invention has been described in detail and with reference to specific embodiments thereof, it will be apparent to one skilled in the art that various changes and modifications can be made therein without departing from the spirit and scope thereof.

The present disclosure relates to the subject matter contained in Japanese Patent Application No. 2011-42965, filed on Feb. 28, 2011, the contents of which are expressly incorporated herein by reference in their entirety. All the publications referred to in the present specification are also expressly incorporated herein by reference in their entirety.

The foregoing description of preferred embodiments of the invention has been presented for purposes of illustration and description, and is not intended to be exhaustive or to limit the invention to the precise form disclosed. The description was selected to best explain the principles of the invention and their practical application to enable others skilled in the art to best utilize the invention in various embodiments and various modifications as are suited to the particular use contemplated. It is intended that the scope of the invention not be limited by the specification, but be defined claims set forth below.

What is claimed is:

1. An organic electroluminescence device using in a light-emitting layer having a thickness of 20 nm or more an exciplex of an acceptor compound and a donor compound that satisfies the conditions represented by the following formulae (1) to (4):

$$T_1^A - S_1 > 0.4 \text{ eV} \quad (1)$$

$$T_1^D - S_1 \geq 0.2 \text{ eV} \quad (2)$$

$$|LUMO^A| > 2.0 \text{ eV} \quad (3)$$

$$|HOMO^D| \leq 5.3 \text{ eV} \quad (4)$$

wherein $T_1^A$ represents the excited triplet energy defined by the peak wavelength on the short wavelength side in the phosphorescence spectrum of the acceptor compound; $T_1^D$ represents the excited triplet energy defined by the peak wavelength on the short wavelength side in the phosphorescence spectrum of the donor compound; $S_1$ represents the excited singlet energy of the exciplex defined by the peak wavelength of the exciplex light emission observed in the light-emitting layer; $LUMO^A$ represents the energy level of LUMO (lowest unoccupied molecular orbital) of the acceptor compound; and $HOMO^D$ represents the energy level of HOMO (highest occupied molecular orbital) of the donor compound.

2. The organic electroluminescence device according to claim 1, which is so designed that the light-emitting layer is laminated between a layer containing the acceptor compound and a layer containing the donor compound.

3. The device of claim 1 wherein the light-emitting layer consists of the acceptor compound and the donor compound.

4. The organic electroluminescence device according to claim 1, wherein the light-emitting layer exists when no voltage is applied to the device.

5. The organic electroluminescence device according to claim 1, wherein the light-emitting layer has a thickness of from 20 nm to 80 nm.

* * * * *